United States Patent [19]

Kamon et al.

[11] Patent Number: 5,264,898
[45] Date of Patent: Nov. 23, 1993

[54] PROJECTION EXPOSURE APPARATUS

[75] Inventors: Kazuya Kamon, Itami; Teruo Miyamoto; Yasuhito Myoi, both of Amagasaki, all of Japan

[73] Assignee: Mitsubishi Denki Kabushiki Kaisha, Tokyo, Japan

[21] Appl. No.: 936,646

[22] Filed: Aug. 28, 1992

[30] Foreign Application Priority Data

Aug. 29, 1991 [JP] Japan .................................. 3-217796
Jan. 31, 1992 [JP] Japan .................................. 4-016281
Jul. 31, 1992 [JP] Japan .................................. 4-204989

[51] Int. Cl.$^5$ ........................ G03B 27/42; G03B 27/54
[52] U.S. Cl. ........................................ 355/67; 355/53; 355/71
[58] Field of Search ................... 355/43, 53, 71, 67

[56] References Cited

U.S. PATENT DOCUMENTS

| | | | |
|---|---|---|---|
| 4,619,508 | 10/1986 | Shibuya et al. | 355/67 X |
| 5,144,362 | 9/1992 | Kamon et al. | 355/53 |
| 5,160,962 | 11/1992 | Miura et al. | 355/53 |
| 5,208,818 | 5/1993 | Gelbart et al. | 372/30 |

FOREIGN PATENT DOCUMENTS 61-91662  5/1986  Japan .

*Primary Examiner*—Richard A. Wintercorn
*Attorney, Agent, or Firm*—Leydig, Voit & Mayer

[57] ABSTRACT

A projection exposure apparatus for use in LSI production comprises a light source, a light condensing optical system through which light from the light source is condensed and applied to a mask carrying a circuit pattern, a projection lens system which projects the light transmitted through the mask onto the surface of a wafer, and an aperture member which is interposed between the light source and the light condensing optical system. The aperture member has a light transmission region for transmitting the light from the light source and a light-interrupting member disposed to extend across the light transmission region. The shape or configuration of the light-interrupting member is determined in accordance with the geometry of the circuit pattern formed on the mask.

20 Claims, 27 Drawing Sheets

FIG. I

PROJECTION EXPOSURE APPARATUS

BACKGROUND OF THE INVENTION

1. Field of the Invention

The present invention relates to a projection exposure apparatus which is used for the purpose of forming a fine pattern in production of LSIs.

2. Description of the Related Art

FIG. 46 shows a known projection exposure apparatus. This known apparatus has a fly-eye lens 3 which is disposed to confront the front side of the lamp house 1 across a mirror 2. An aperture member 4 is disposed in front of the fly-eye lens 3, and an exposure mask 8 having a desired circuit pattern is disposed to face the aperture member 4 across condenser lenses 5, 6 and a mirror 7. A wafer 10 is disposed in front of the mask 8 so as to oppose the latter across a projection lens system 9. As will be seen from FIGS. 47 and 48, the aperture member 4 has a disk-like member having a central circular aperture 4a.

Light emitted from the lamp house 1 impinges upon the fly-eye lens 3 through the mirror 2, so as to be divided into regions corresponding to the elementary lenses 3a which form the fly-eye lens 3. The light components which have passed through the elementary lenses 3a illuminate the whole region of the mask 8 through the aperture 4a of the aperture member 4, condenser lens 5, mirror 7 and the condenser lens 6. Thus, the light components from the elementary lenses 3a are superposed one on another to uniformly illuminate the mask 8. The light which has passed through the mask 8 reaches the wafer 10 past the projection lens system 9, whereby a circuit pattern is printed on the surface of the wafer 10.

It is well known that, in projection exposure apparatus of the kind described, the minimum resolution R is proportional to $\lambda/NA$, where $\lambda$ represents the wavelength of the light employed and NA represents the aperture number of the optical system. Hitherto, therefore, design of the optical system has been done in such a way as to employ a large aperture number NA so as to enhance the resolution of the projection exposure apparatus, thus coping with the current demand for higher degree of scale of integration of LSI circuits.

Increase in the aperture number NA in one hand improves the resolution, i.e., reduces the minimum resolution R bur on the other hand reduces the depth of focus DOF of the projection exposure apparatus. The focal depth DOF is proportional to $\lambda/NA^2$ In the known projection exposure apparatus, therefore, an increase in the aperture number NA for improving the resolution is inevitably accompanied by degradation of the transfer precision due to reduction in the focal depth.

FIG. 49 illustrates a light source image formed in the pupil 9a of the projection lens system 9 when the circuit pattern of the mask 8 has parallel-line pattern of a minuteness level approximating the resolution limit. A light source image $S_0$ is formed by the 0-order light on the center of the pupil 9a, while light source images $S_1$ and $S_2$ are formed by first-order light on both sides of the light source image $S_0$. For instance, the light $L_0$ passing through the center of the 0-order light source image $S_0$ interferes with the lights $L_1$ and $L_2$ passing through the centers of the fist-Order light source images $S_1$ and $S_2$, so as to form a pattern on the wafer 10. The aperture number NA is given by $\sin\theta_1$, representing the angle of incidence of each of the lights $L_1$ and $L_2$ on the wafer 10 by $\theta$, Consequently, the focal depth DOF decreases as the angle of incidence of the light to the wafer 10 increases.

In order to avoid reduction in the focal depth DOF, Japanese Patent Laid-Open No. 61-91662 discloses a projection exposure apparatus which employs a ring-shaped aperture member. In this art, as shown in FIG. 50, the lights $L_0$ to $L_2$ passing through the centers of the respective light-source images $S_0$ to $S_2$ are interrupted by the aperture member Consequently, lights passing through the peripheral portions of the pupil 9 are interrupted in the region near the resolution limit, the angle $\theta_2$ of incidence of lights to the wafer 10 is reduced to offer an appreciable improvement in the focal depth DOF. Referring to FIG. 50, however, the lights $L_4$ and $L_5$, among the lights $L_3$ to $L_5$ passing through the upper edges of the light source images $S_0$ to $S_2$, which are directed to regions outside the pupil 9a are interrupted by the pupil 9a. Consequently, the light $L_3$ of the 0-order light source image $S_0$ merely contributes to illumination of the background, without being focused in the wafer 10. Consequently, the contrast of the image is seriously impaired to deteriorate the transfer precision.

Referring to FIG. 51, there are shown lights $L_6$ to $L_8$ which pas through left portions of the light source images $S_0$ to $S_2$, among which the light $L_8$ of the $-1$-order light source image $S_2$ is interrupted by the pupil 9a. Consequently, the light $L_6$ of the 0-order light source image $S_0$ interferes only with the light $L_7$ of the $+1$-order light source image $S_1$, so as to form an image on the wafer 10. Similarly, the light passing through the hatched region $Q_0$ of the 0-order light source image $S_0$ interferes only with the light passing through he hatched region $Q_1$ of the $+1$-order light source image $S_1$, and the light passing through the right hatched region $R_0$ of the 0-order light source image $S_0$ interferes only with the light passing through he hatched region $R_2$ of the $-1$-order light source image $S_2$, Thus, in the hatched areas $Q_0$, $Q_1$, $R_0$ and $R_1$, one of the light of the $+1$-order light source image $S_1$ and the light of the $-1$-order light source $S_2$ cannot make contribution to the formation of the image.

It is assumed here that the mask 8 has a line-and-space circuit pattern having light-interrupting portions 8a and light-transmitting portions 8b having the same width, as shown in FIG. 52. In such a case, the 0-order light source image $S_0$ has an amplitude $T_0$ of 0.5, while the amplitudes $T_1$ and $T_2$ of the $-1$-order light source images $S_1$ and $S_2$ are 063/2. In FIG. 51, the amplitudes T0 to T2 are represented by thickness of the disks which indicate the light source images $S_0$ to $S_2$. Am optical image with large amplitude E is advantageously obtained as shown in FIG. 53 when all the light source images $S_0$ to $S_2$ having amplitudes $T_0$ to $T_2$ contribute to the formation of the image. However, when one of the lights of the $+1$-order light source image $S_1$ and the light of the $-1$-order light source image $S_2$ do not contribute to the formation of the image, only a small amplitude F of the optical image is obtained, resulting in an inferior contrast of the image.

FIGS. 54 and 55 show Levenson type phase shift mask. This mask has a transparent substrate 8c on which provided at a constant pitch are parallel Cr light-interrupting members 8d so that light-transmitting portion and shading portion are formed alternately. Phase shift members 8e of for example, SOG are formed in every other light-transmitting portions. When this type of phase shift mask is used, in the region where the phase shift member 8e and the transparent substrate 8c neighbor each other as viewed on the planar pattern, the light which has been transmitted both through the phase shift member 8e and the transparent substrate 8c and the light which has passed only through the transparent substrate 8c interfere with each other, so that the light intensity is reduced to zero. Therefore, when a positive resist is used, the pattern on the wafer is partly deformed as at 10b so that the patterns 10a to be formed by the light interrupting members 8d are undesirably connected, resulting in an impaired transfer accuracy.

SUMMARY OF THE INVENTION

Accordingly, an object of the present invention is to provide a projection exposure apparatus which can provide higher transfer precision, thereby overcoming the above-described problems of the prior art.

To this end, according to the present invention, there is provided a projection exposure apparatus, comprising: a light source; a light condensing optical system through which light from the light source is condensed and applied to a mask carrying a circuit pattern; a projection lens system which projects the light transmitted through the mask onto the surface of a wafer; and an aperture member which is interposed between the light source and the light condensing optical system; wherein the aperture member has a light transmission region for transmitting the light from the light source and a light-interrupting member disposed to extend across the light transmission region.

The light-interrupting member used in the aperture member can have various forms such as belt-like form, bobbin-like form, cross-form centered at the center of the transmission region and radial form centered at the center of the transmission region.

The arrangement may be such that the aperture member has belt-like first and second light-interrupting members which extend across the transmission region passing the center of the latter and which are rotatable about the center of the transmission region.

DESCRIPTION OF THE PREFERRED EMBODIMENTS

Preferred embodiments of the present invention will be described with reference to the accompanying drawings.

Figure 1:
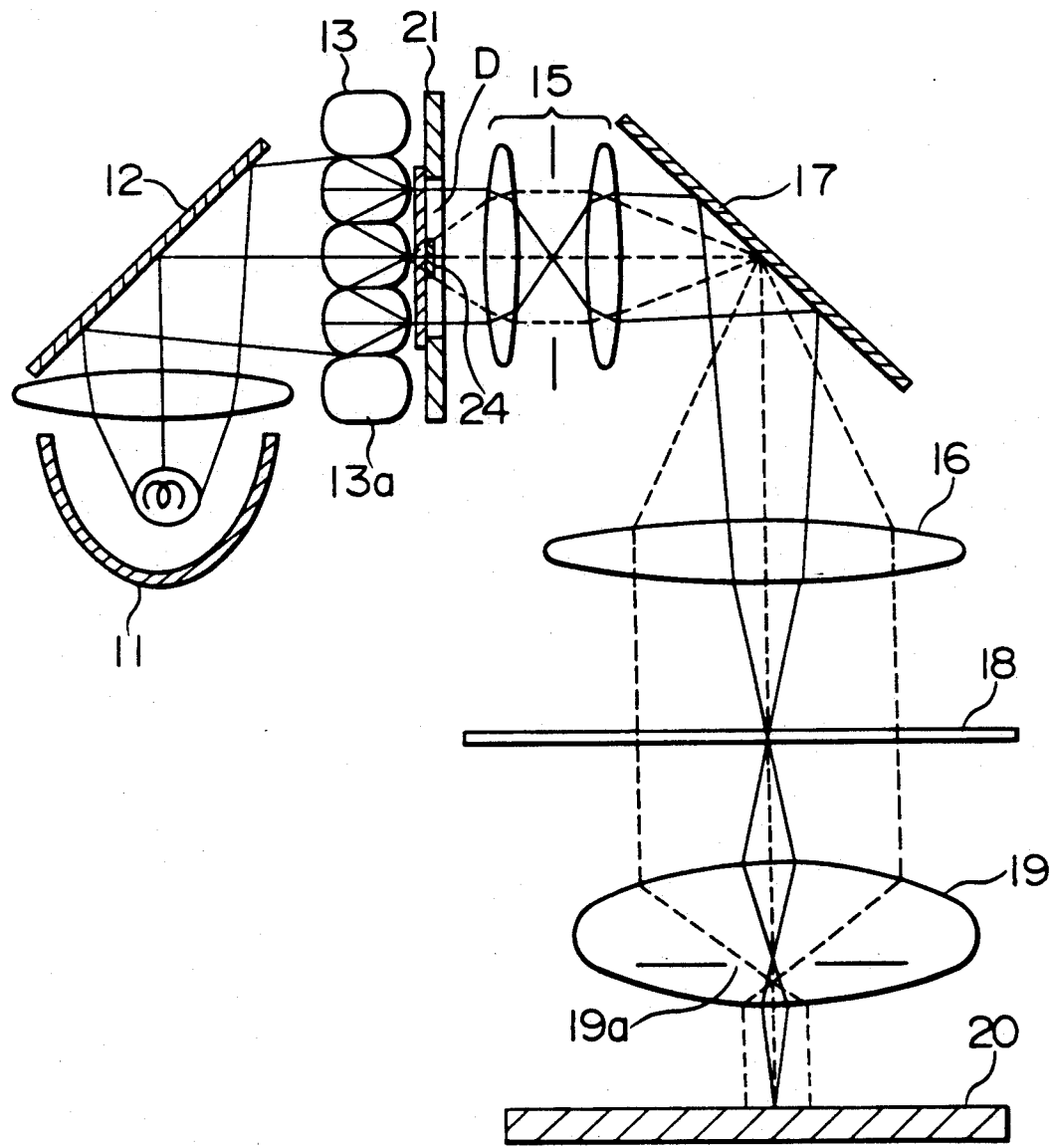
FIG. 1 is an illustration of an optical system incorporated in the first embodiment of the projection exposure device of the present invention.

FIG. 1 illustrates an optical system used in a first embodiment of the projection exposure apparatus of the present invention. The optical system includes a lamp house 11 for emitting light of a wavelength λ. Light from the lamp house 11 is reflected by a mirror 12 and impinges upon a fly-eye lens 13 on the emitting side of which is disposed an aperture member 21. The light passed through the aperture member 21 is made to impinge upon an exposure mask 18 carrying a desired circuit pattern, past condenser lenses 15, 16 and a mirror 17. A wafer 20 is disposed o oppose the mask 18 across a projection lens system 19. The lamp house 11, mirror 12 and the fly-eye lens 13 form a light source, while the condenser lenses 15, 16 and the mirror 17 form a condensing lens system.

Figure 2:
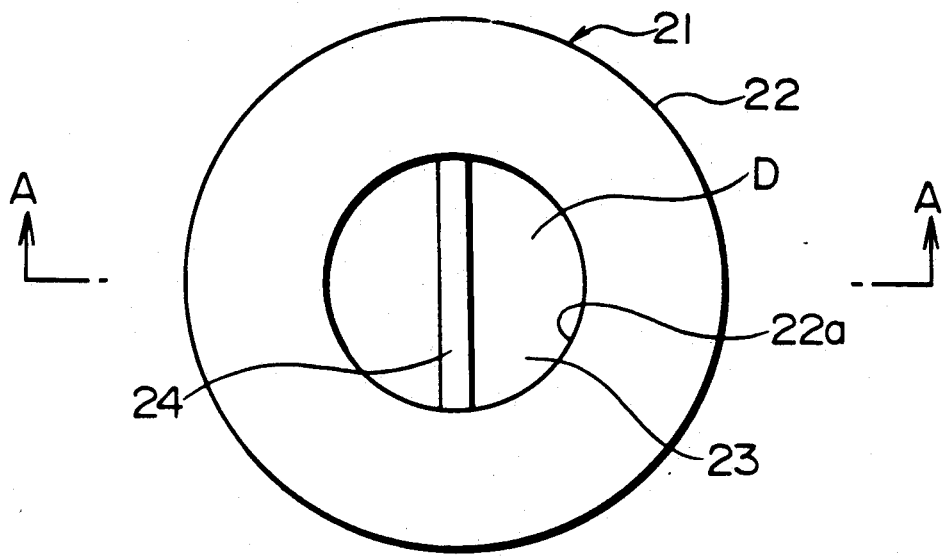
FIG. 2 is a plan view of an aperture member used in the first embodiment.
Figure 3:
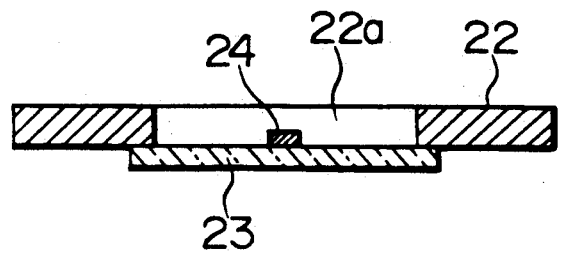
FIG. 3 is a sectional view taken along the line A—A of FIG. 2.

As will be seen from FIGS. 2 and 3, the aperture member has a disk-shaped frame 22 having a central circular aperture 22a, a transparent member 23 which is formed to cover the entire area of the opening 22a in the frame 22 and a belt-like light-interrupting member 24 which is formed on a surface of the transparent member 23 so as to extend across the opening 22a in the frame 22. The opening 22a in the frame 22 defines a transmission region D which transmits light from the lamp house 11. The frame 22 and the light-interrupting member 24 may be formed of a metal such as aluminum, while the transparent member 23 may be formed of, for example, a sheet of glass. The light-interrupting member 24 may be formed by vacuum evaporation of the metal material on the transparent member 23.

A description will now be given of the operation of this embodiment. The light emitted from the lamp house 11 is reflected by the mirror 12 so as to impinge upon the fly-eye lens 13 so as to be divided into components corresponding to the elementary lenses 13a. The light components which have passed through the respective elementary lenses 13a are made to pass through the light transmission region D of the aperture member 21 to illuminate the entire area of the mask 18 past the condenser lens 15, mirror 17 and the condenser lens 16. Thus, the light components from the elementary lenses 13a of the fly-eye lens 13 are superposed on one another to uniformly illuminate the mask 18. The light then passes through the mask 18 to be focused on the wafer 20 past the projection lens system 19, whereby the circuit pattern is printed on the surface of the wafer 20.

Figure 4:
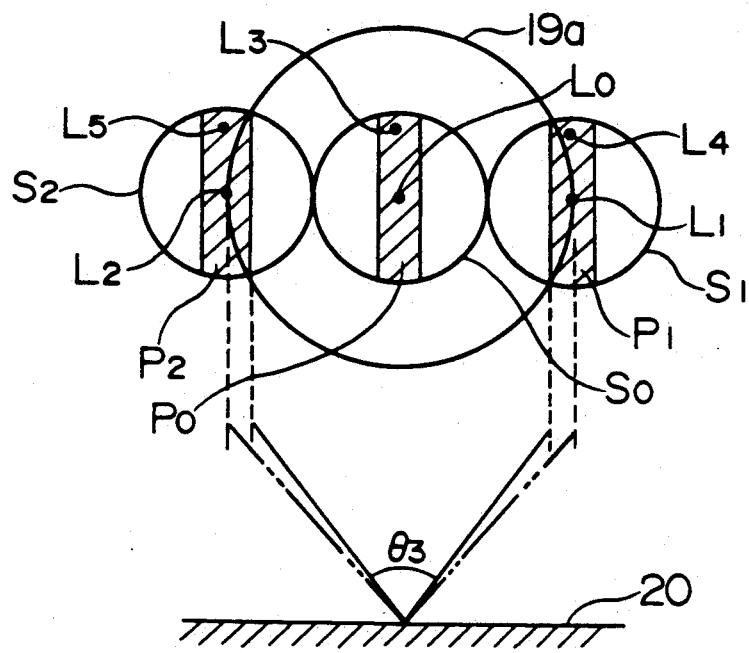
FIG. 4 is an illustration of the relationship between a light source image formed on the pupil of a projection lens system and the angle of incidence of light to a wafer, as obtained when the aperture member of FIG. 2 is used together with a mask having a circuit pattern which is a parallel-line pattern approximating resolution limit.

FIG. 4 illustrates a light source image which is formed on the pupil 19a of the projection lens system 19 when the circuit pattern on the mask 18 is a parallel-line pattern of fineness approximating the resolution limit. A light source image $S_0$ is formed by the 0-order light on the center of the pupil 19a, while light source images $S_1$ and $S_2$ are formed on the left and right sides of the light source image $S_0$ by the 1-order lights, respectively. These light source images $S_0$ to $S_2$ have belt-like light-interrupted portions $P_0$ to $P_2$ which are formed by the light-interrupting member 24 of the aperture member 21. Assuming that the belt-like light-interrupting member 24 is parallel to the parallel-line pattern on the mask 18, the light-interrupted portions $P_1$ and $P_2$ of the 1-order light source images $S_1$ and $S_2$ are located On the periphery of the pupil 19a as shown in FIG. 4. Referring to FIG. 4, therefore, the lights $L_0$ to $L_2$ having axes on the centers of the light source images $S_0$ to $S_2$ and the lights $L_3$ to $L_5$ passing through the upper edge portions of the light source images $S_0$ to $S_2$ are interrupted by the light-interrupting member 24 of the aperture member 21. Consequently, the angle $\theta_3$ of incidence to the wafer 20 is reduced to improve the focal depth DOF, whereas the lights which contribute only to illumination of the background are interrupted so as to avoid degradation of the contrast.

Figure 5:
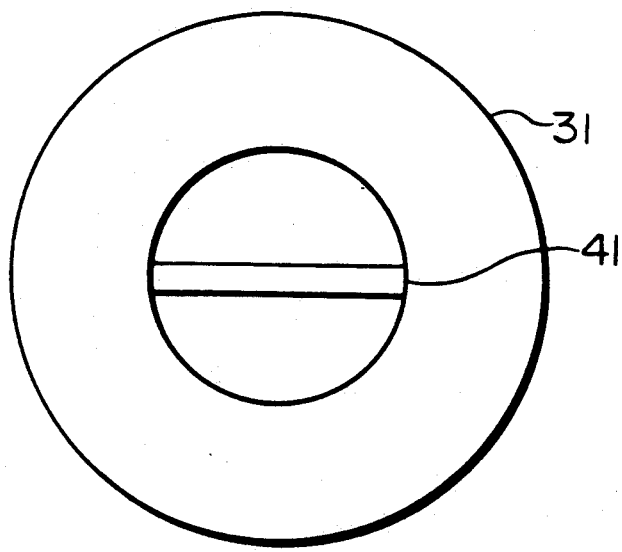
FIGS. 5 to 10 are plan views of aperture members used in the second to seventh embodiments.
Figure 6:
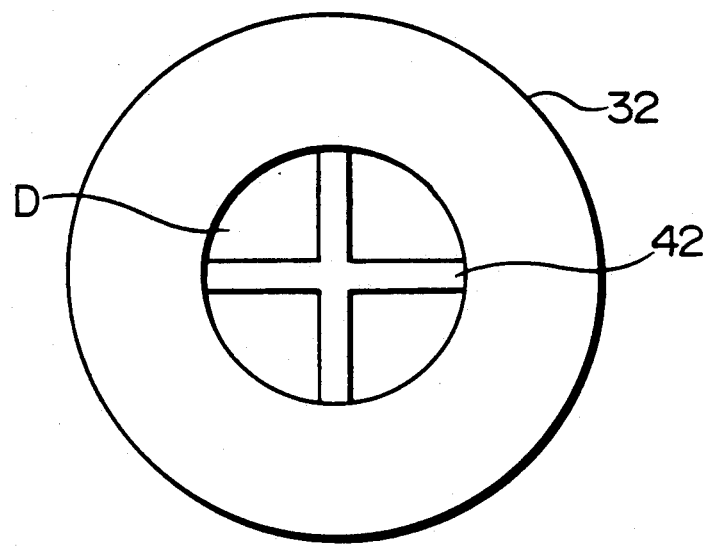

It is preferred that, a described above, the light-interrupting member 24 of the aperture member 21 is parallel to the parallel-line pattern on the mask 18. Therefore, when the mask 18 has a parallel-line pattern orthogonal to that of the first embodiment, it is recommended to use an aperture member 31 which has a laterally-extending light-interrupting member 41 as shown in FIG. 5.

Figure 7:
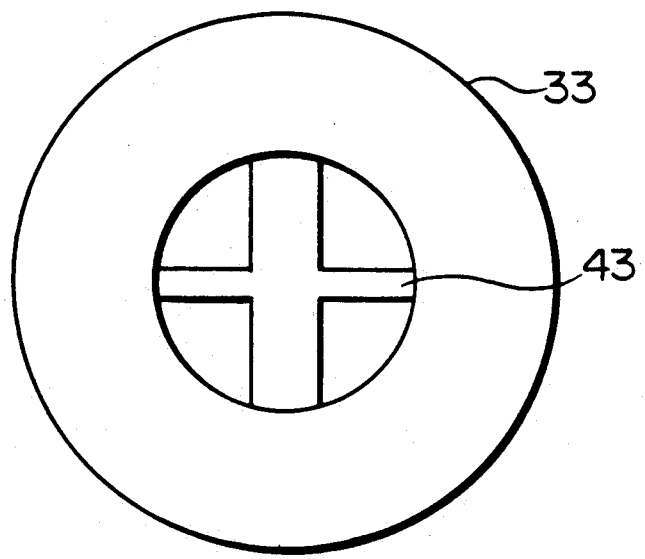

When the mask has a composite pattern composed of two orthogonal parallel-line patterns, it is effective to use an aperture member 32 which has a cross-shaped light-interrupting member 42 centered at the center of the transmission region D. When these two orthogonal parallel-line patterns have different line pitches, an aperture member 33 of FIG. 7 is conveniently used which has a cross-shaped light-interrupting member 43 having vertical and horizontal portions of different widths.

Figure 8:
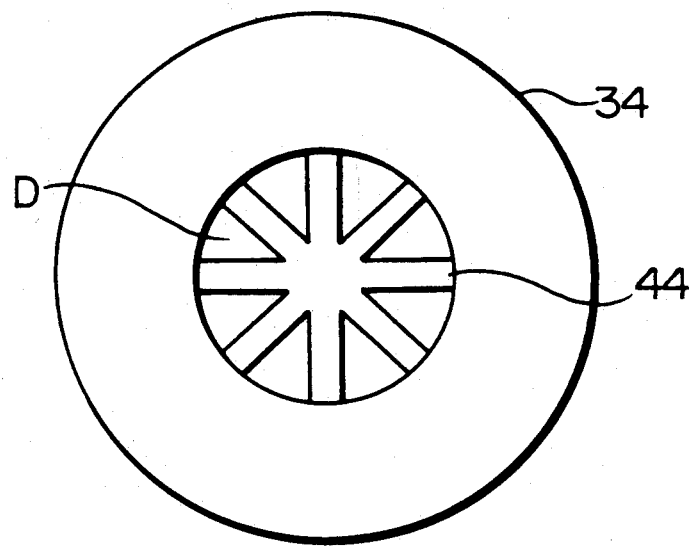

When the mask 18 has oblique patterns in addition to two orthogonal parallel-line patterns, it is preferred to use an aperture member of FIG. 8 which has radial light-interrupting member 44 which is centered at the center of the light transmitting region D.

Figure 9:
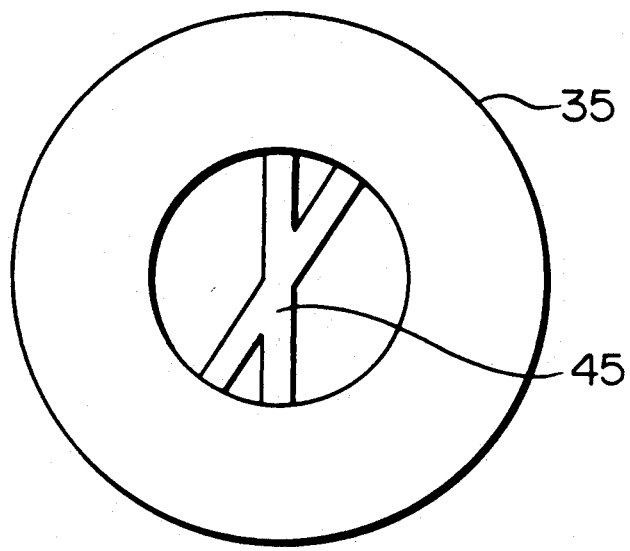

When the mask 18 has oblique patterns inclined at specific angles, e.g., 30° and 60°, it is advisable to use an aperture member 35 of FIG. 9 which has a light-interrupting member 45 composed of two belt-like portions which are inclined at the same angles as those of the mask pattern and which cross each other at the same angle as that in the mask pattern.

Figure 10:
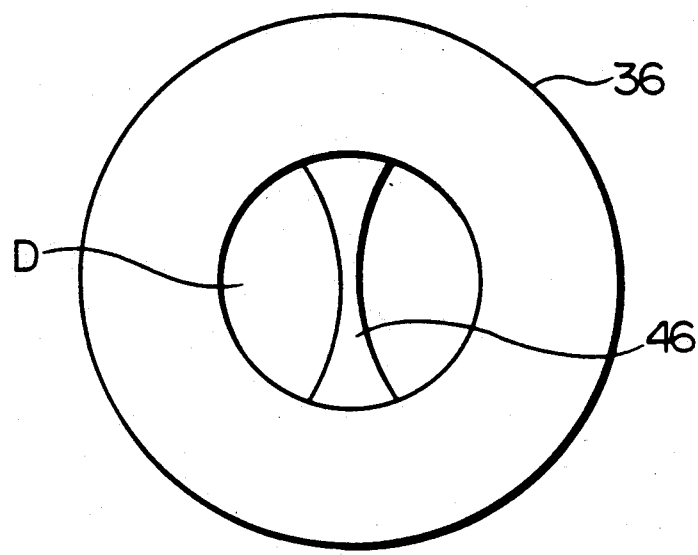
Figure 11:
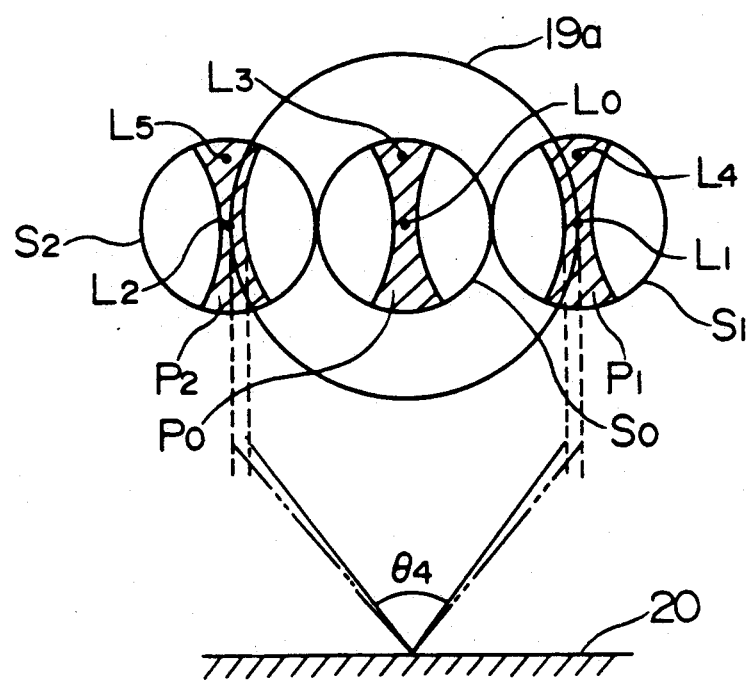
FIG. 11 is an illustration of the relationship between a light source image formed on the pupil of a projection lens system and the angle of incidence of light to a wafer, as obtained when the aperture member of FIG. 10 is used together with a mask having a circuit pattern which is a parallel-line pattern approximating resolution limit.

It is also possible to use an aperture member 36 of FIG. 10 which has a light-interrupting member 46 extending across the light-transmitting region D and having a bobbin-like form. FIG. 11 illustrates the light source image which is formed on the pupil 19a of the projection lens system 19 when the aperture member 36 of FIG. 10 is used together with the parallel-line pattern of a fineness approximating the resolution limit. As will be seen from FIG. 11, the lights $L_0$ to $L_2$ having optical axes on the centers of the light source images S0 to S2 and the light L3 to L5 passing through upper edge portions of the light source images S0 to S2 are interrupted by the light-interrupting member 46 of the aperture member 36. Consequently, the angle $\theta_4$ of incidence to the wafer 20 is reduced to improve the focal depth DOF, whereas the lights which contribute only to illumination of the background are interrupted so as to avoid degradation of the contrast. By using a bobbin-shaped light-interrupting member 46, it is possible to effectively interrupt only the components of the light from the light source which act to impair the contrast of the optical image and the focal depth.

Figure 12:
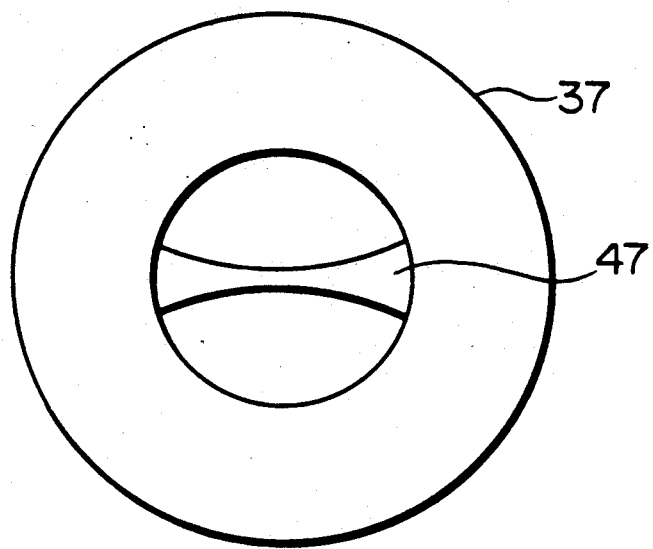
FIGS. 12 to 15 are plan views of aperture members used in the eighth to eleventh embodiments.
Figure 13:
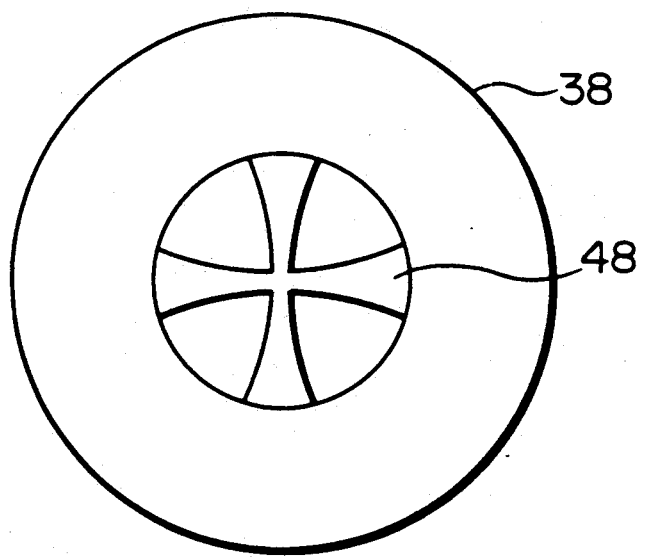
Figure 14:
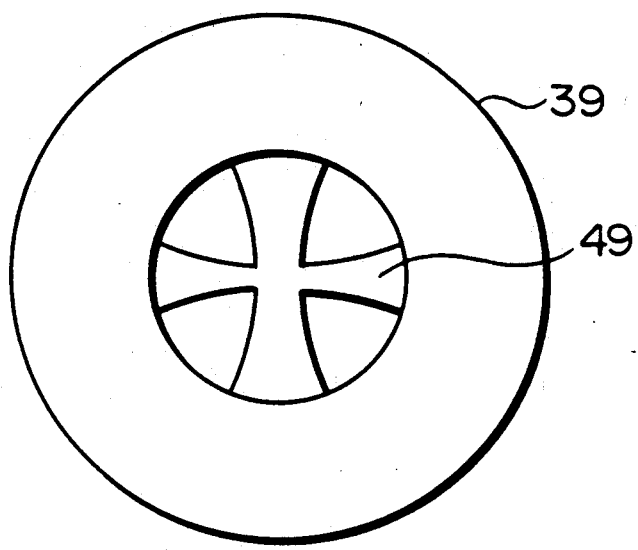

The aperture member having a bobbin-shaped light-interrupting member can have various modified forms in accordance with the pattern on the mask 18, such as an aperture member 37 with a horizontal light-interrupting member 47 as shown in FIG. 12, an aperture member 38 having a cross-shaped light-interrupting member 48 as shown in FIG. 13 and an aperture member 39 having cross-shaped light-interrupting member 49 having vertical and horizontal portions of different widths, as shown in FIG. 14.

Figure 15:
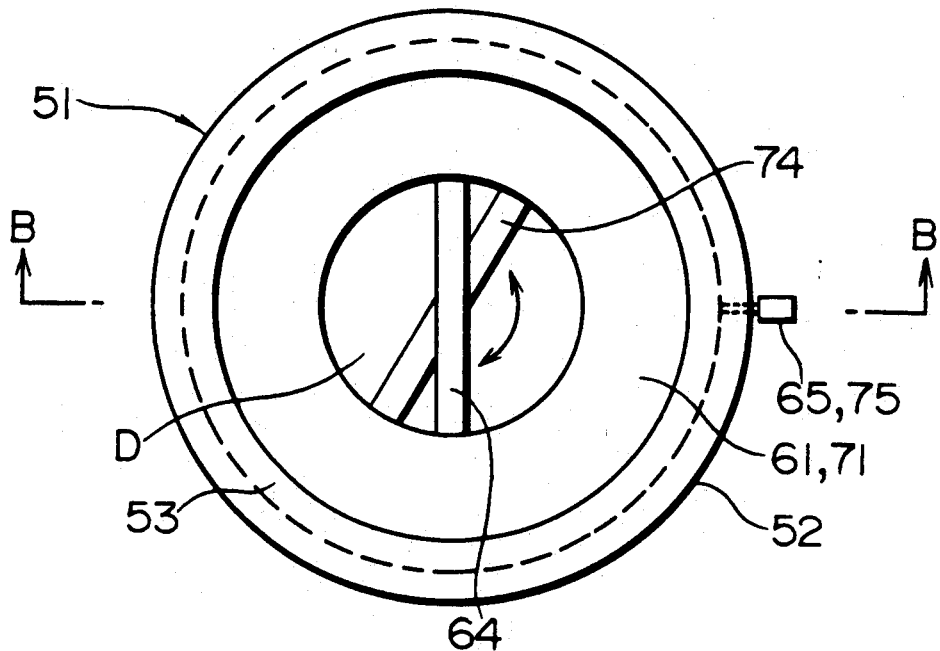
Figure 16:
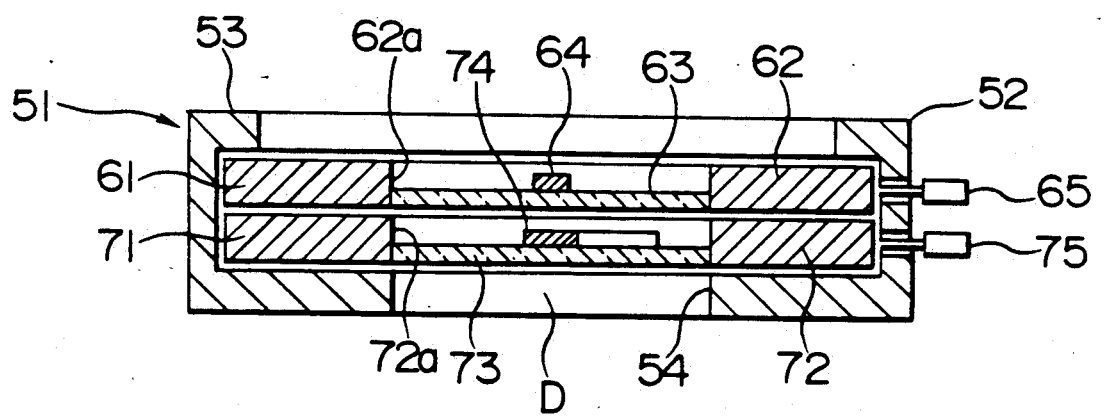
FIG. 16 is a sectional view taken along the line B—B of FIG. 15.

FIGS. 15 and 16 show an aperture member 51 having first and second belt-like light-interrupting members 64 and 74 which are rotatable relative to each other. More specifically, this aperture member has a cylindrical casing 52 and first and first and second rotational members 61 and 71 which are rotatably encased by the casing 52. A flange 53 is formed on the upper side of he casing 52 so as to project inward from the inner peripheral edge thereof, and a circular aperture 54 defining the light transmitting region of the aperture member 51 is formed in the center of the lower wall of the casing 52. The first and second rotational members 61 and 71 have, respectively, disk-shaped frames 62 and 72 having central circular apertures 62a and 72a, transparent members 63 and 73 formed to close the entire areas of the apertures 62a an 72a, and belt-shaped light-interrupting members 64 and 74 which are formed on the surfaces of the transparent members 63 and 73 so as to extend across the apertures 62a and 72a. Levers 65 and 75 are secured to the frames 62 and 72 of the first and second rotational members 61 and 71, respectively, so as to project to the exterior of the casing 52.

The arrangement is such that the rotational members 61 and 71 are independently rotated within the casing 52 as the associated levers 65 and 75 are moved circumferentially. Thus, the first and second rotational members are rotatable about the center of the light-transmitting region D, thus enabling the control of the angles of the first and second light-interrupting members 64 and 74 in accordance with the pattern held by the mask 18. By using this aperture member 51, it is possible to obtain a projection exposure apparatus having a high degree of utility.

Figure 17:
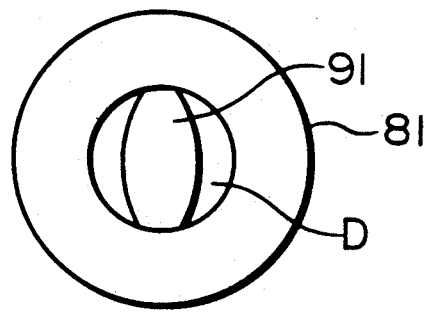
FIG. 17 is a plan view of an aperture member used in a twelfth embodiment.
Figure 18:
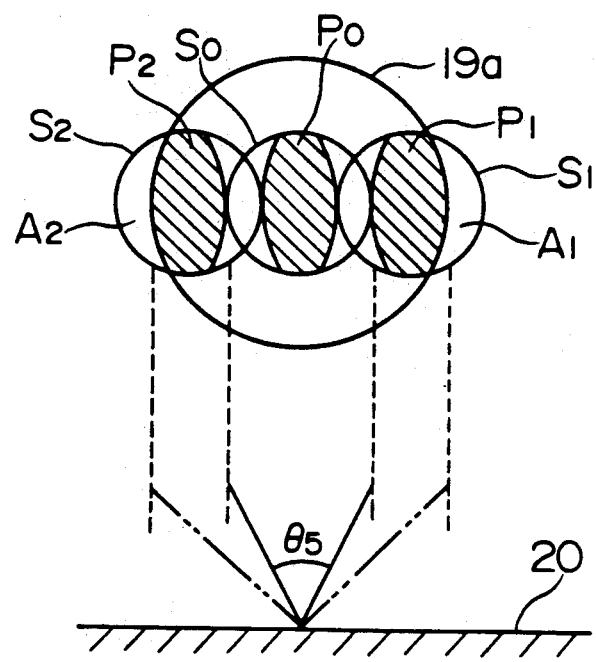
FIG. 18 is an illustration of the relationship between a light source image formed on a pupil of a projection lens system and angle of incidence to a wafer.

It is also possible to use an aperture member in which, as denoted by 81 in FIG. 17, the light-interrupting member 91 has such a spindle-like form as to extend transversely of the light transmitting region D. FIG. 18 shows a light source image which is formed on the pupil 19a of the projection lens system 19 when this aperture member 81 is used together with a mask 18 whose circuit pattern includes a comparatively coarse parallel line pattern. As will be seen from FIG. 18, each of the light source images S0 to S2 has spindle-shaped light-interrupted portion P0 to P2 and light-transmitted portions on both sides of the light-interrupting portion. The light-transmitted portions A1 and A2 of the primary light source images S1 and S2 are cut by the pupil 19a of the projection lens system 19, so that the angle $\theta_5$ of incidence to the wafer 20 is reduced. As a consequence, the depth of focus DOF is improved. The use of the aperture member 81 having the spindle-shaped light-interrupting member 91 offers an advantage particularly when the circuit pattern has a practical size.

Figure 19:
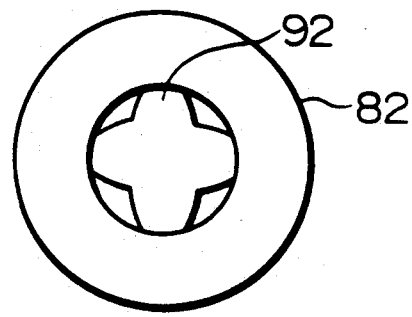
FIGS. 19 and 20 are plan views of aperture members used in thirteenth and fourteenth embodiments.

When the mask 18 has parallel-line patterns which orthogonally cross each other, it is effective to use an aperture member 82 shown in FIG. 19 which has a spindle-and cross-shaped light-interrupting member 92.

Figure 20:
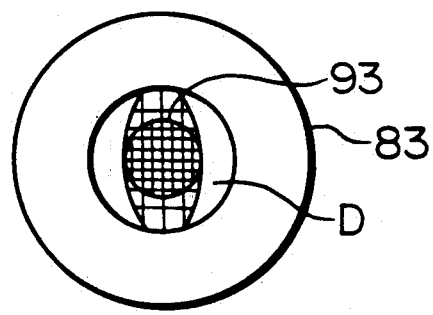
Figure 21:
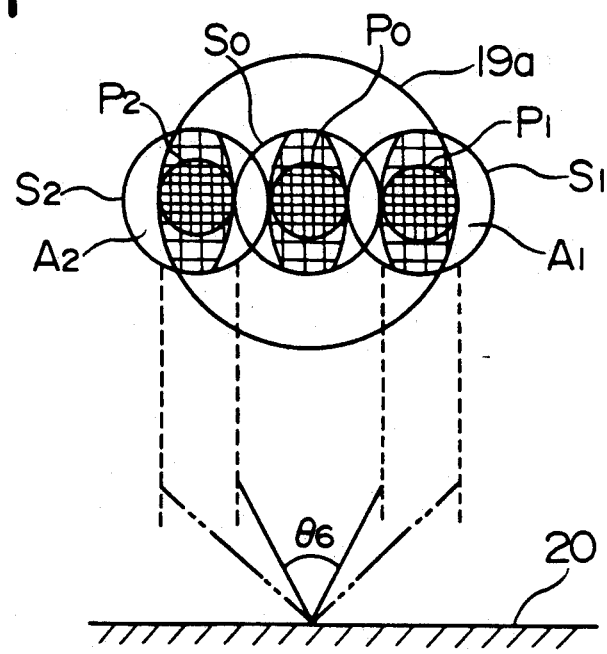
FIG. 21 is an illustration of the relationship between a light source image formed on a pupil of a projection lens system and angle of incidence to a wafer as observed when the aperture member shown in FIG. 20 is used.

It is also possible to use an aperture member 83 shown in FIG. 20 which has a mesh-like light-interrupting member 93 extending transversely of the transmitting region D. FIG. 21 shows the light source image formed on the pupil 19a of the projection lens system when this aperture member 83 is used with a mask 18 whose circuit pattern includes a comparative coarse parallel-line pattern. As will be seen from FIG. 21, each of the light source images S0 to S2 has spindle-shaped light-interrupted portion P0 to P2 and light-transmitted portions on both sides of the light-interrupting portion. The light-transmitted portions A1 and A2 of the primary light source images S1 and S2 are cut by the pupil 19a of the projection lens system 19, so that the angle $\theta_6$ of incidence to the wafer 20 is reduced. As a consequence, the depth of focus DOF is improved. In this case, since the light-interrupting member 93 is formed of a mesh member, the light-interrupting portions P0 to P2 also transmit light although the light quantity is small. It is possible to adjust the effect of the deformed light source method by using this feature. The use of the aperture member 83 having the mesh-type light-interrupting member 93 offers an advantage particularly when the circuit pattern has a practical size.

Although the light-interrupting member 93 shown in FIG. 20 has a spindle-like outer configuration, this is only illustrative and the light-transmitting member 93 can have any other suitable configurations such as belt-like form or bobbin-like form. In FIG. 20, the mesh of the light-interrupting member 93 is finer in the central region of the member 93 than in the peripheral region so as to enhance the light-interrupting effect in the central region of each light source image S0 to S2. This, however, is not exclusive and the light-interrupting member 93 may have a uniform mesh size over the entire area thereof.

Figure 22:
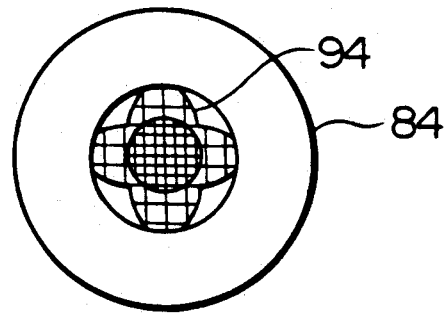
FIGS. 22 and 23 are plan views of aperture members used in fifteenth and sixteenth embodiments, respectively.

When the mask has parallel-line patterns which orthogonally cross each other, it is effective to use an aperture member $\theta 4$ having a cross-shaped meshed light-interrupting member 94 as shown in FIG. 22.

Figure 23:
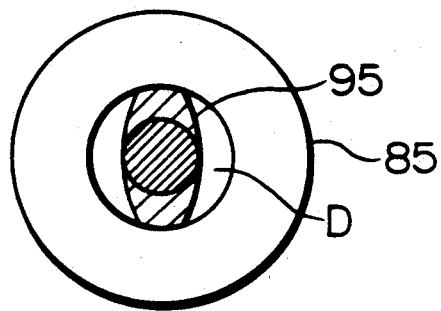
Figure 24:
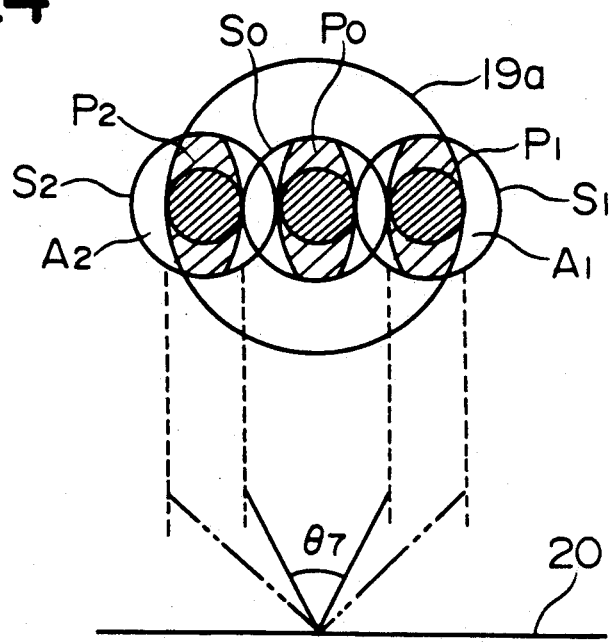
FIG. 24 is an illustration of the relationship between a light source image formed on a pupil of a projection lens system and angle of incidence to a wafer as observed when the aperture member shown in FIG. 23 is used.
Figure 25:
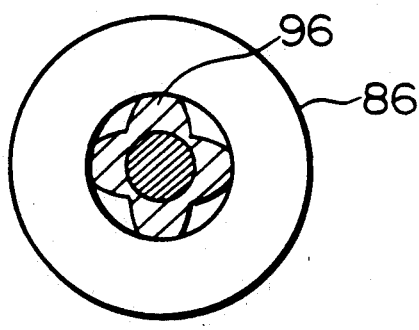
FIG. 25 is a plan view of an aperture member used in a seventeenth embodiment.

It is also possible to use an aperture member 85 shown in FIG. 23 which has a light-interrupting member 95 made of a light-absorption film extending transversely of the transmitting region D. The light-absorption film may be a silicon nitride film. FIG. 24 shows the light source image formed on the pupil 19a of the projection lens system when this aperture member 85 is used with a mask 18 whose circuit pattern includes a comparatively coarse parallel-line pattern. As will be seen from FIG. 24, each of the light source images $S_0$ to $S_2$ has spindle-shaped light-interrupted portion $P_0$ to $P_2$ and light-transmitted portions on both sides of the light-interrupting portion. The light-transmitted portions $A_1$ and $A_2$ of the primary light source images $S_1$ and $S_2$ are cut by the pupil 19a of the projection lens system 19, so that the angle $\theta_7$ of incidence to the wafer 20 is reduced. As a consequence, the depth of focus DOF is improved. In this case, since the light-interrupting member 93 is formed of a light absorption film, the light-interrupting portions $P_0$ to $P_2$ also transmit light although the light quantity is small. It is possible to adjust the effect of the deformed light source method by using this feature. The use of the aperture member 85 having the mesh-type light-interrupting member 95 offers an advantage particularly when the circuit pattern has a practical size.

Although the light-interrupting member 95 shown in FIG. 23 has a spindle-like outer configuration, this is only illustrative and the light-transmitting member 95 can have any other suitable configurations such as belt-like form or bobbin-like form. In FIG. 23, the light-interrupting member 95 is designed to exhibit a greater light absorption in the central region of the member 95 than in the peripheral region, by being thickened at its central region, so as to enhance the light-interrupting effect in the central region of each light source image $S_0$ to $S_2$. This, however, is not exclusive and the light-interrupting member 93 may have a uniform light absorption distribution over the entire area thereof.

When the mask has parallel-line patterns which orthogonally cross each other, it is effective to use an aperture member 86 having a cross-shaped light-interrupting member 96 made of a cross-shaped light absorption film as shown in FIG. 22.

Figure 26:
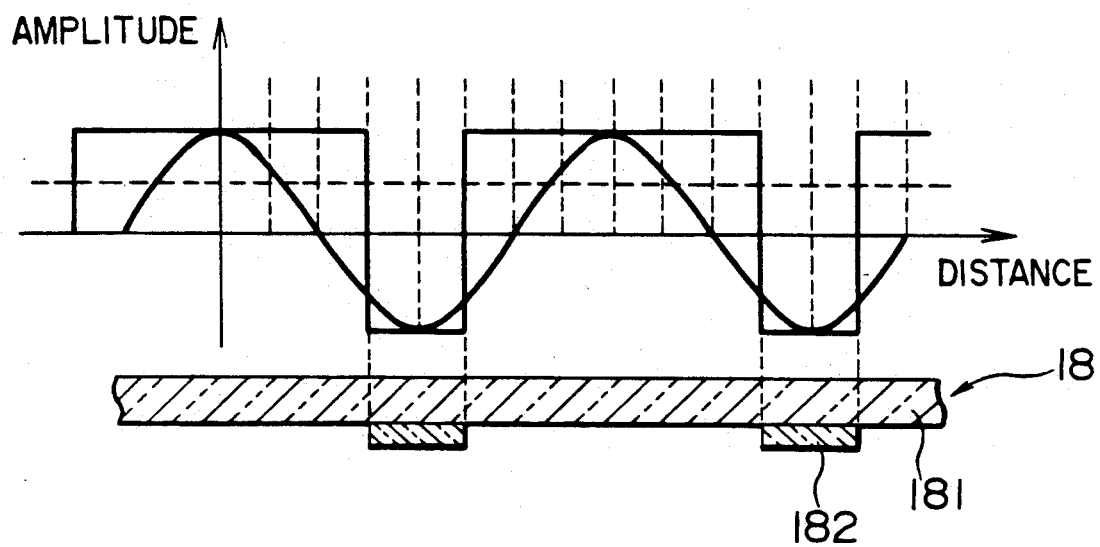
FIG. 26 is an illustration of a mask used in a eighteenth embodiment.
Figure 27:
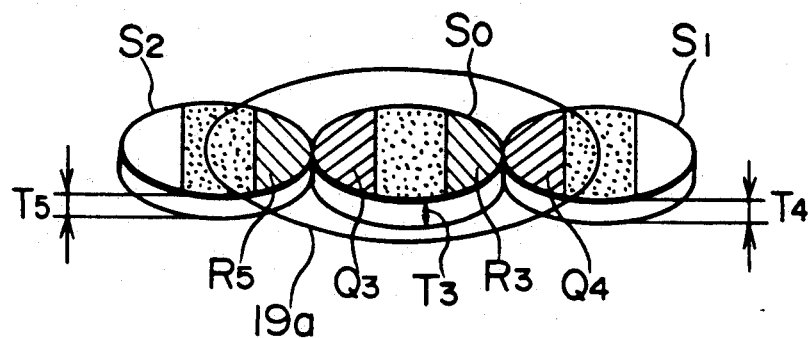
FIG. 27 is an illustration of a light source image formed on a projection lens system when the mask of FIG. 26 is used.

The mask 18 may be of a type shown in FIG. 26 which has a circuit pattern formed by shifter-shade type phase shift member 182 formed on a transparent glass substrate 181. The phase shift member 182 is made from, for example, SOG. It is assumed that the phase shift member has such a thickness as to cause a phase differential amounting to half the wavelength $\lambda$ of the light used in the projection exposure apparatus, and that a line-and-space pattern is formed in such a manner that the ratio of the width of the phase shift member 182 to the width of the portion of the transparent glass substrate 181 devoid of the phase shift member 182 is 1:3. In such a case, as shown in FIG. 27, the amplitude $T_3$ of the 0-order light source image $S_0$ is 0.5 and the amplitudes $T_4$ and $T_5$ of the +1-order light source image $S_1$ and the −1-order light source image $S_2$ are respectively 0.9/2. That is to say, by forming the circuit pattern from shifter-shade type phase shift members 182, it is possible to increase the amplitudes of the +1-order and −1-order light source images $S_1$ and $S_2$ by about 1.5 times as compared with the mask 8 of FIG. 39 composed of light-interrupting and transmitting portions, while maintaining the amplitude of the 0-order light source image $S_0$ at the same level. In FIG. 27, the amplitudes $T_3$ to $T_5$ of the light-source images $S_0$ to $S_2$ are represented by the thicknesses of the disks which indicate the light source images $S_0$ to $S_2$, respectively.

Figure 28:
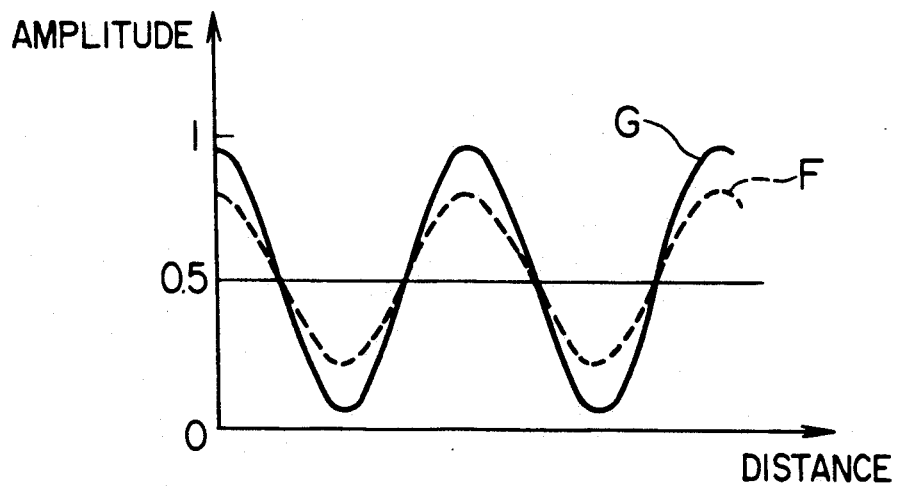
FIG. 28 is an illustration of the amplitude of the optical image formed on a wafer by the use of the mask shown in FIG. 26.
Figure 52:
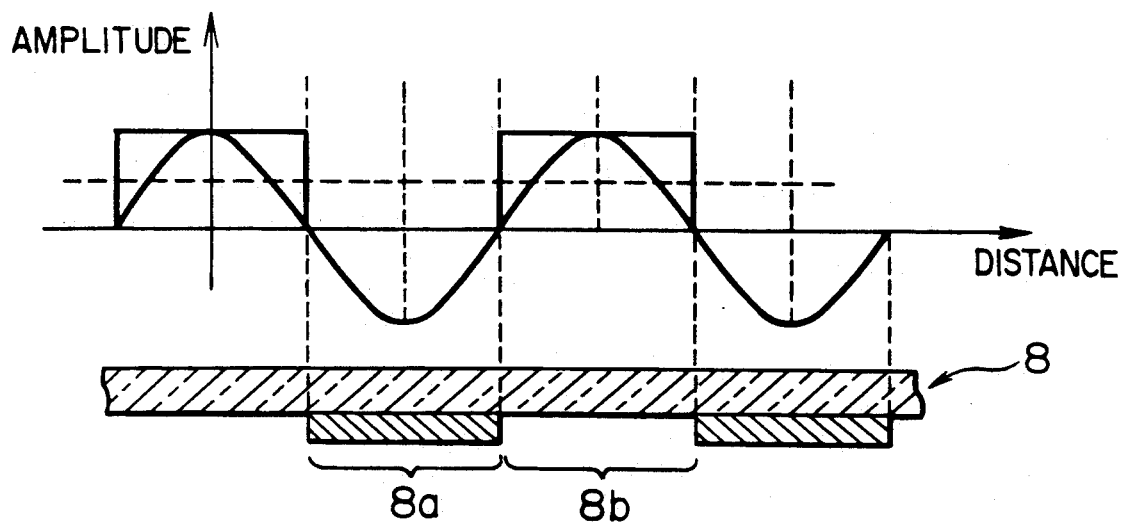
FIG. 52 is an illustration of a shifter-shade type phase shift mask.
Figure 53:
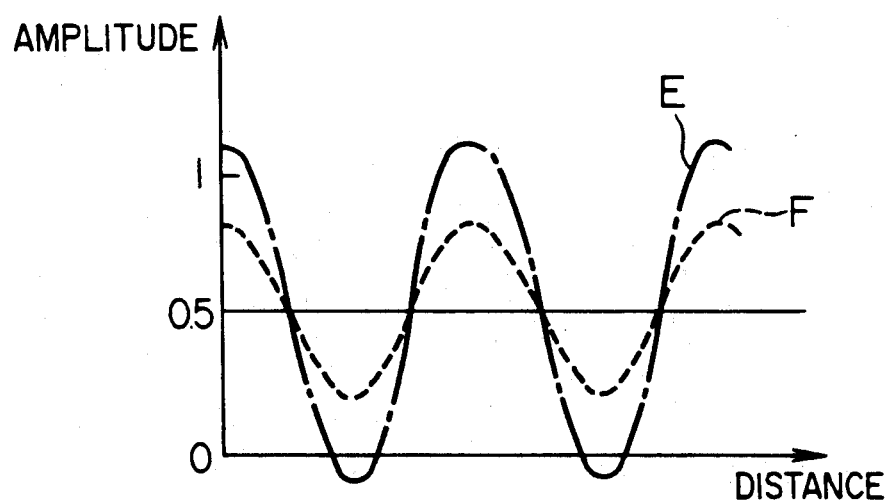
FIG. 53 is a graph showing the amplitude of light source image formed on a wafer with the use of the mask shown in FIG. 52.

As will be understood from FIG. 27, the light passing through the hatched region $Q_3$ of the 0-order light source image $S_0$ interferes only with the light passed through the hatched region $Q_4$ of the +1-order light source image $S_1$, whereas the light passing through the right hatched region $R_3$ of the 0-order light source image $S_0$ interferes only with the light passing through the hatched area $R_5$ of the 1-order light source image $S_2$, thus forming an image. That is, the 0-order light source image $S_0$ interferes only with the light of one of the +1-order light source image $S_1$ and the −1-order light source image $S_2$. By forming the pattern on the mask 18 with the phase shift member 182 of shifter-shade type, the amplitude of the +1-order and −1-order light source images $S_1$ and $S_2$ are increased by about 1.5 times. Consequently, as shown in FIG. 28, the optical image formed on the wafer 20 has an amplitude G which is greater than the amplitude F obtained when the mask 8 of FIG. 52 is used, thus attaining an improvement in the image contrast, as well as in the transfer precision.

The ratio of the width of the phase shift member 182 as shown in FIG. 26 is only illustrative, and an equivalent effect is obtained by using a mask having a different value of the width ratio.

Figure 29:
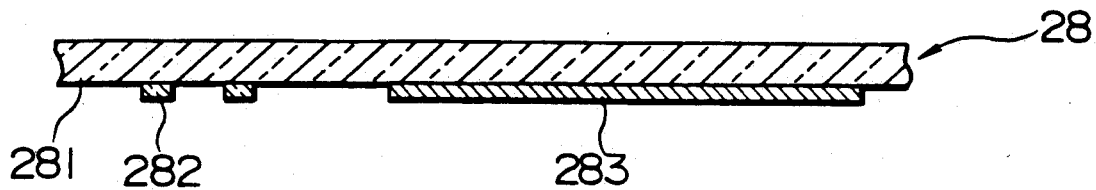
FIG. 29 is a sectional view of a mask used in a nineteenth embodiment of the present invention.

In addition, it is not always necessary that the circuit pattern on the mask is wholly composed of the phase shift members. For instance, as a mask 28 shown in FIG. 29, the arrangement may be such that, while a repetitional pattern is formed by the phase shift members 282 of shifter-shade type n the transparent glass substrate 281, the pattern in a sufficiently wide light transmission region is formed by an ordinary metal light-interrupting member such as Cr because in such a wide light-interruption region the influence of interference between the 0-order light and the lights of +1-order and −1-order is small.

Figure 30:
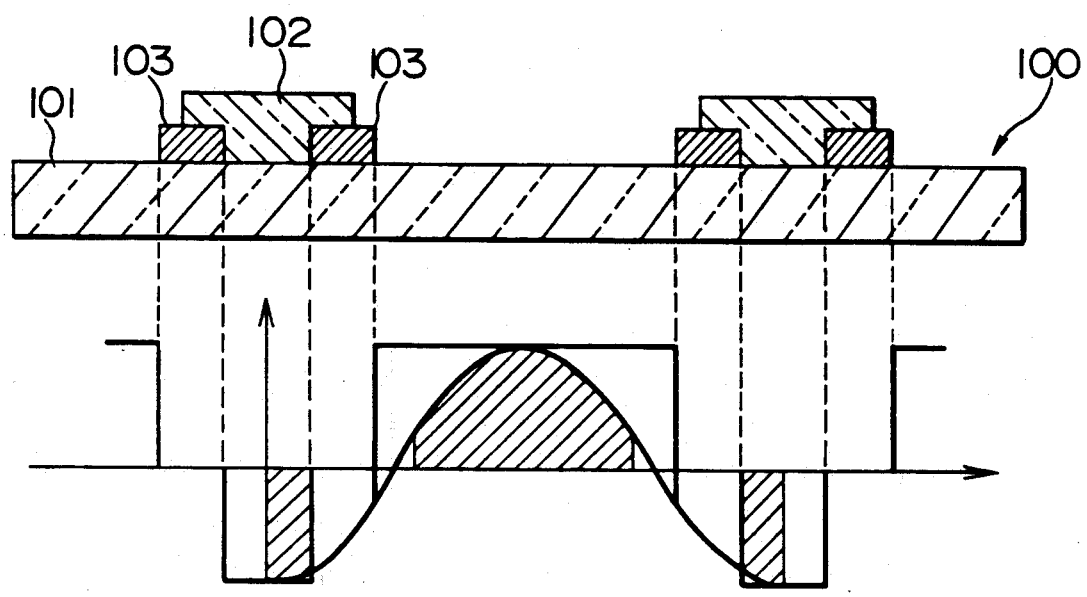
FIGS. 30 to 32 are sectional views of the masks used in 20th to 22nd embodiment and amplitudes of optical image son wafers.

It is possible to use a shifter-shade type mask of the type denoted by 100 in FIG. 30. This mask 100 has a transparent substrate 101 and a phase shifter member 102 of shifter-shade type formed thereon. Furthermore, a light-interrupting member 103 such as of Cr is formed on the peripheral edge portion of the phase shifter member 102. When this mask 100 is used, the amplitude of the transmitted light is proportional to the area of the hatched region of the amplitude distribution shown in FIG. 30. It is therefore possible to control the quantity of the light transmitted, by varying the size of the light-interrupting member 103.

Figure 31:
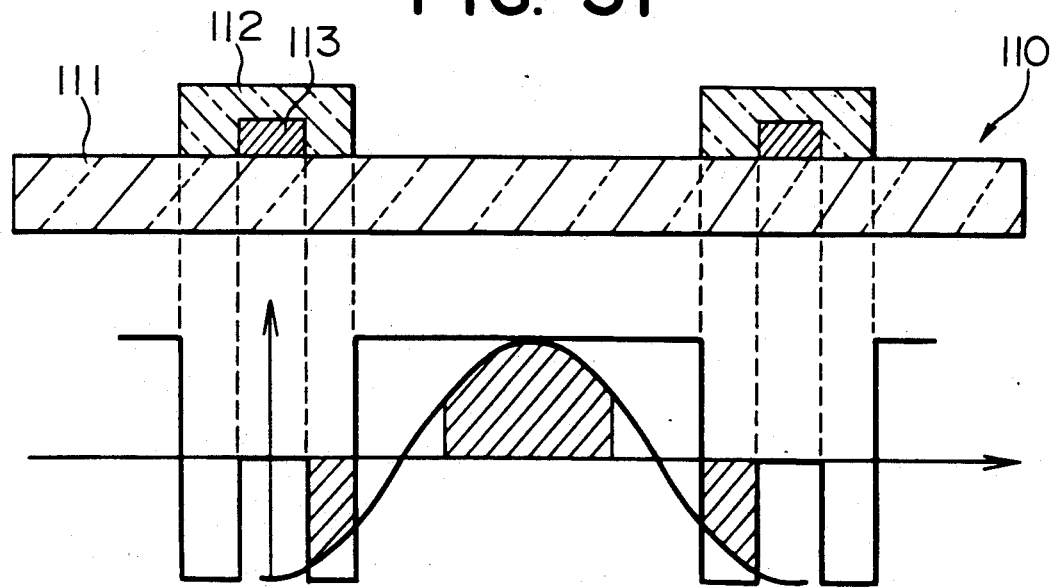

It is possible to use a shifter-shade type mask of the type denoted by 110 in FIG. 31. This mask 110 has a transparent substrate 111 and a phase shifter member 112 of shifter-shade type formed thereon. Furthermore, a light-interrupting member 113 is formed on the center of the phase shifter member 112. When this mask 110 is used, the amplitude of the transmitted light is proportional to the area of the hatched region of the amplitude distribution shown in FIG. 31. It is therefore possible to control the quantity of the light transmitted, by varying the size of the light-interrupting member 113.

Figure 32:
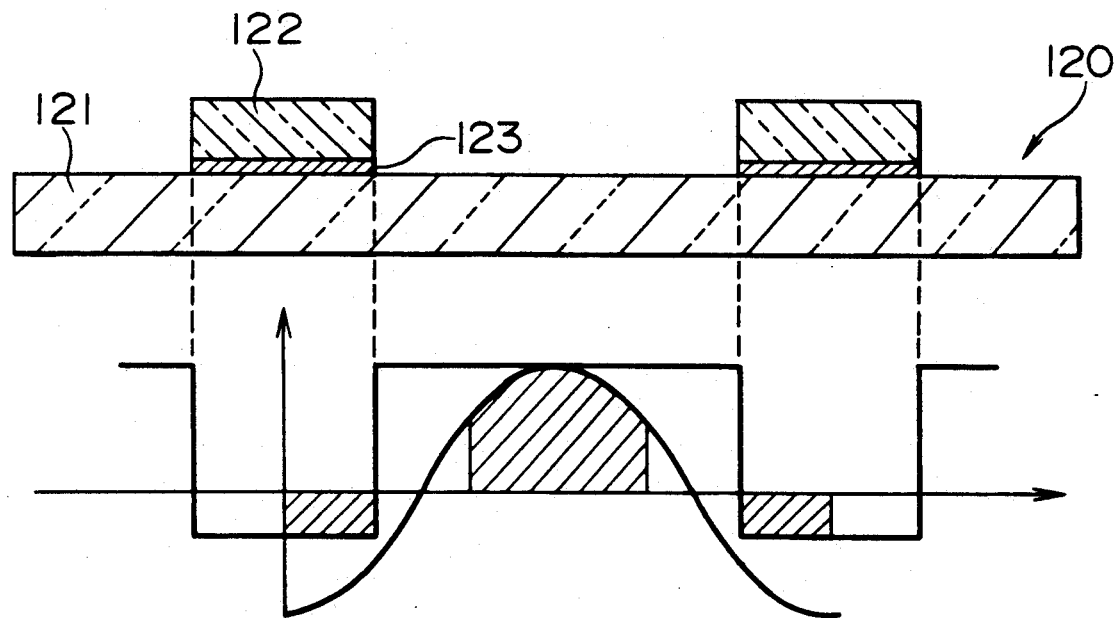

It is possible to use a shifter-shade type mask of the type denoted by 120 in FIG. 32. This mask 120 has a transparent substrate 121 and a phase shifter member 122 of shifter-shade type formed thereon through the intermediary of a halftone light-interrupting member 123, whereby a translucent pattern is formed. When this mask 120 is used, the amplitude of the transmitted light is proportional to the area of the hatched region of the amplitude distribution shown in FIG. 32. It is therefore possible to control the quantity of the light transmitted, by varying the size of the translucent pattern.

Figure 33:
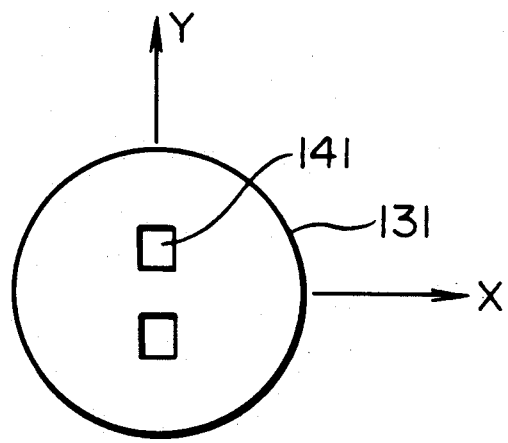
FIG. 33 is a plan view of an aperture member used in the 23rd embodiment.
Figure 54:
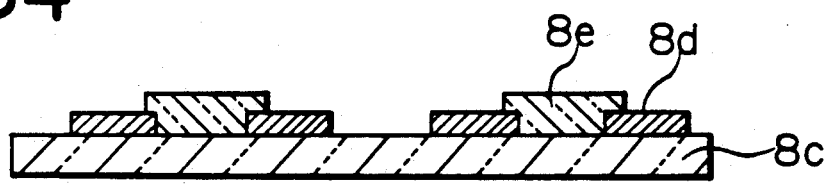
FIG. 54 is a sectional view of a Levenson type phase shift mask.
Figure 55:
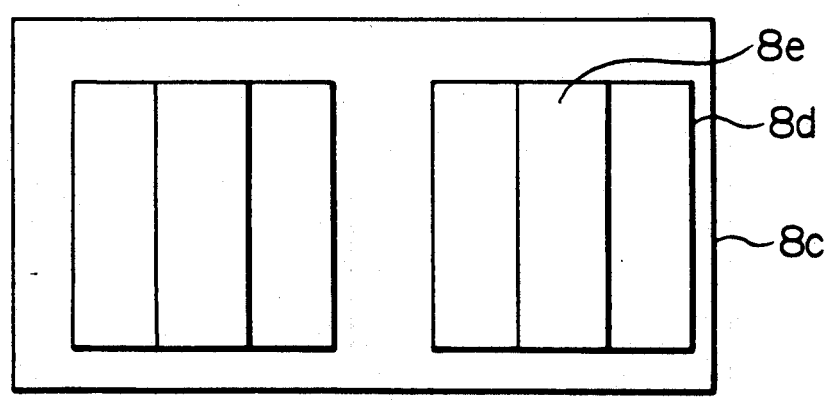
FIG. 55 is a plan view of the mask shown in FIG. 54.
Figure 56:
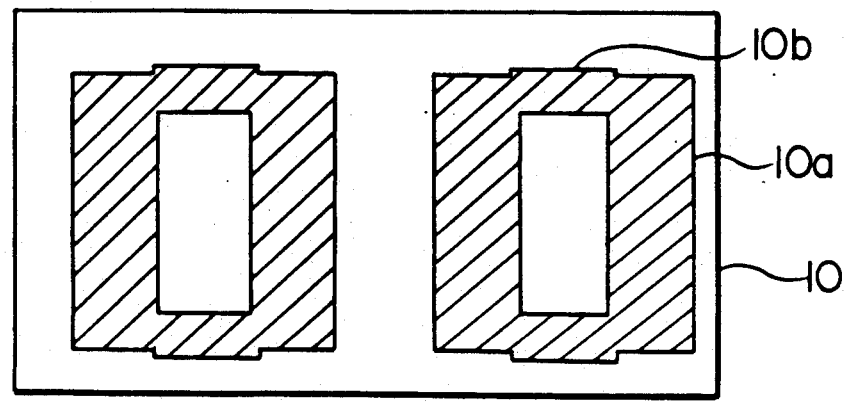
FIG. 56 is a plan view of a wafer showing a positive resist pattern formed thereon when the mask of FIG. 54 is formed.

When a Levenson type phase shift mask shown in FIGS. 54 and 55 is employed, it is preferred to use an aperture member 131 shown in FIG. 33. This aperture member has a pair of light-transmitting portions 141 arranged in the center thereof in the direction Y shown in FIG. 33, while other portions interrupt light. By using this aperture member 131, it is possible to obtain different spatial coherency in X and Y directions. More specifically, coherency is higher in X direction than in Y direction.

Figure 34:
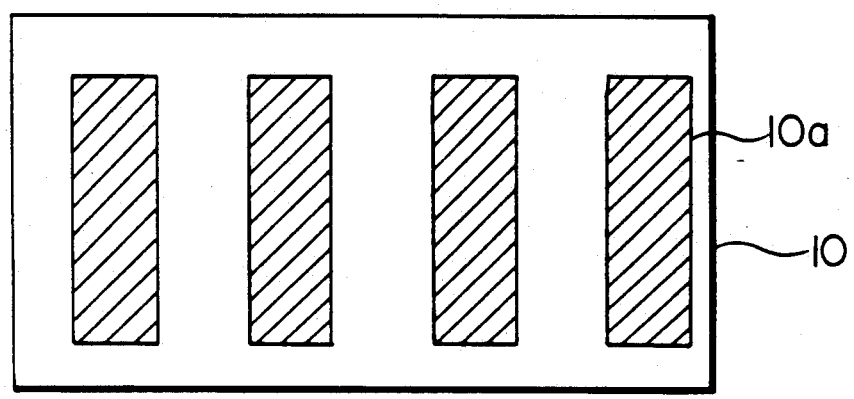
FIG. 34 is a plan view of a positive resist pattern on a wafer as obtained when the aperture member of FIG. 33 is used.

The direction of the aperture member 131 is then set such that the direction Y in which the pair of light-transmitting portions 141 are arranged extend in parallel with the parallel-line pattern of the phase shift mask. This arrangement conveniently reduces the tendency of interference between the light which has passed both through the phase shift member 8e and the transparent substrate 8c and the light which has transmitted through the transparent substrate 8c alone, in the boundary region between the phase shift member 8e and the transparent substrate 8c of the phase shift mask shown in FIG. 55. Consequently, when a positive resist is used for example, it is possible to accurately form the pattern determined by the light-interrupting member 8d on the wafer 10, without any local deformation of the pattern, as will be seen from FIG. 34.

Figure 35:
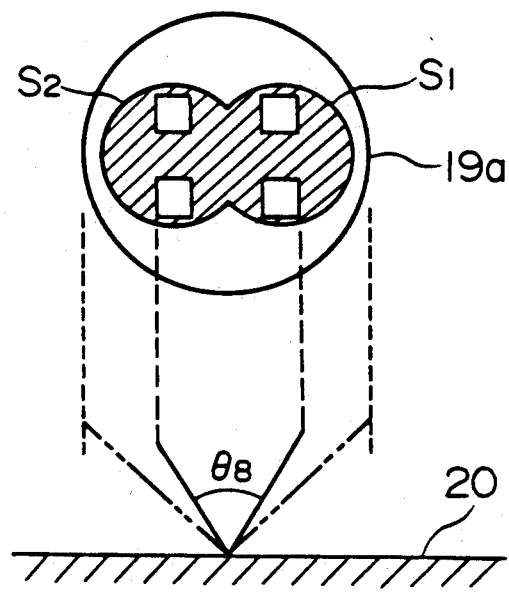
FIG. 35 is an illustration of the relationship between an optical image formed on the pupil of a projection lens system and angle of incidence to a wafer, as obtained when the aperture member of FIG. 33 is used.

FIG. 35 shows a light source image which is formed on the pupil 19a of the projection lens system 19 when the above-described aperture member 131 is used. In this case, since a Levenson type phase shift mask is employed, light source images $S_1$ and $S_2$ of +1-order and −1-order are formed at positions closer to the center of the pupil 19a as compared with the case where a light-interrupting or shifter-shading phase shift mask is used. As a consequence, the angle $\theta_8$ of incidence to the wafer 20 is reduced to improve the depth of focus DOF.

Figure 36:
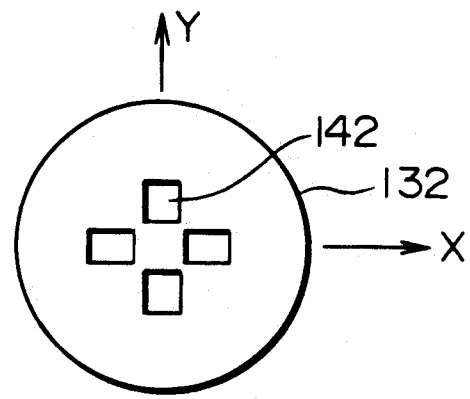
FIGS. 36 and 37 are plan views of the aperture members used in 24th and 25th embodiments, respectively.

When the mask have parallel-line patterns orthogonal to each other, it is effective to use an aperture member 132 having two pairs of light-transmitting portions 142 arrange din X and Y directions, respectively, as shown in FIG. 36.

Figure 37:
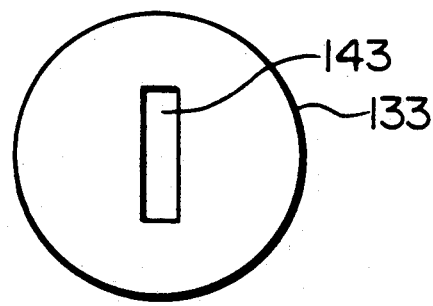
Figure 38:
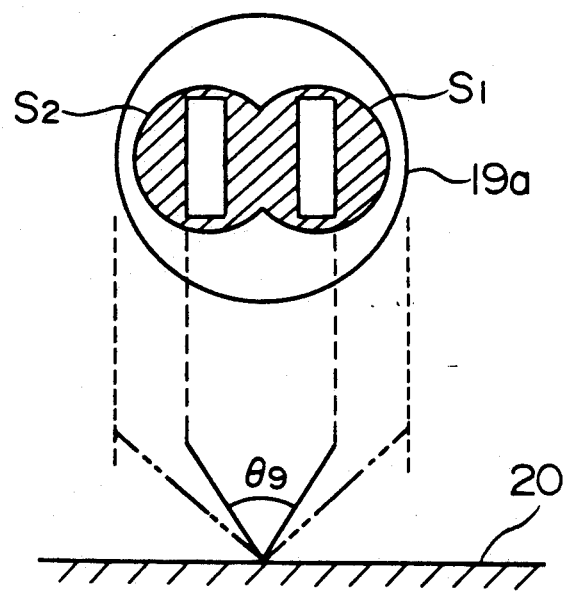
FIG. 38 is an illustration of the relationship between an optical image formed on the pupil of a projection lens system and angle of incidence to a wafer, as obtained when the aperture member of FIG. 37 is used.

FIG. 37 shows an aperture member 133 in which an elongated rectangular light-transmitting portion 143 is formed in the center thereof. This aperture member 133 provides substantially the same effect as that produced by the aperture member 131 of FIG. 33. FIG. 38 shows a light source image which is formed on the pupil 19a of the projection lens system 19 when the above-described aperture member 133 is used. In this case, since a Levenson type phase shift mask is employed, light source images $S_1$ and $S_2$ of +1-order and −1-order are formed at positions closer to the center of the pupil 19a as compared with the case where a light-interrupting or shifter-shading phase shift mask is used. As a consequence, the angle $\theta_9$ of incidence to the wafer 20 is reduced to improve the depth of focus DOF.

Figure 39:
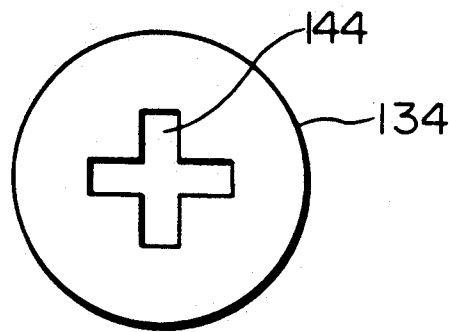
FIGS. 39 and 40 are plan views of the aperture members used in 26th and 27th embodiments, respectively.

When the mask have parallel-line patterns orthogonal to each other, it is effective to use an aperture member 134 having a cross-shaped light-transmitting portion 144 as shown in FIG. 39

Figure 40:
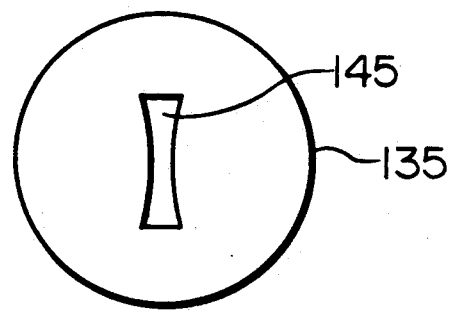
Figure 41:
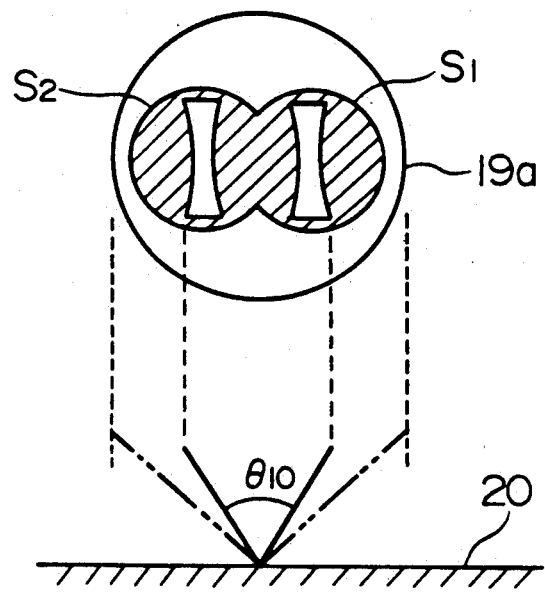
FIG. 41 is an illustration of the relationship between an optical image formed on the pupil of a projection lens system and angle of incidence to a wafer, as obtained when the aperture member of FIG. 40 is used.

When the Levenson type phase shift mask has a fine parallel-line pattern, it is preferred to use an aperture member 135 shown in FIG. 40 having a central bobbin-shaped light-transmitting portion 145. FIG. 41 shows a light source image which is formed on the pupil 19a of the projection lens system 19 when the above-described aperture member 135 is used. In this case, since a Levenson type phase shift mask is employed, light source images $S_1$ and $S_2$ of +1-order and −1-order are formed at positions closer to the center of the pupil 19a as compared with the case where a light-interrupting or shifter-shading phase shift mask is used. As a consequence, the angle $\theta_{10}$ of incidence to the wafer 20 is reduced to improve the depth of focus DOF.

Figure 42:
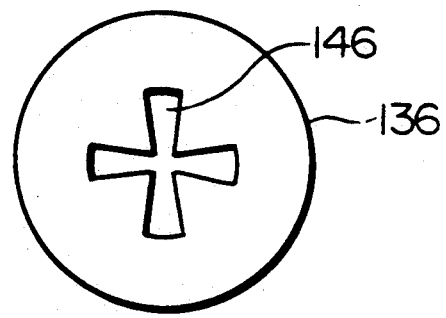
FIGS. 42 and 43 are plan views of the aperture members used in 28th and 29th embodiments, respectively.

When the mask have parallel-line patterns orthogonal to each other, it is effective to use an aperture member 136 having a bobbin-cross-shaped light-transmitting portion 146 as shown in FIG. 42.

Figure 43:
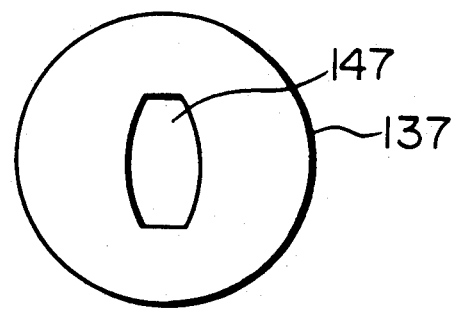
Figure 44:
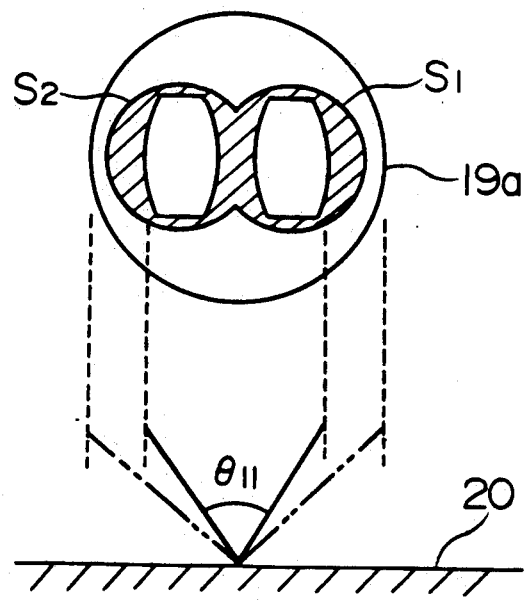
FIG. 44 is an illustration of the relationship between an optical image formed on the pupil of a projection lens system and angle of incidence to a wafer, as obtained when the aperture member of FIG. 43 is used.

In contrast, when the Levenson type phase shift mask has a coarse parallel-line pattern, it is preferred to use an aperture member 137 shown in FIG. 43 having a central spindle-shaped light-transmitting portion 147. FIG. 44 shows a light source image which is formed on the pupil 19a of the projection lens system 19 when the above-described aperture member 137 is used. In this case, since a Levenson type phase shift mask is employed, light source images $S_1$ and $S_2$ of +1-order and −1-order are formed at positions closer to the center of the pupil 19a as compared with the case where a light-interrupting or shifter-shading phase shift mask is used. As a consequence, the angle $\theta_{11}$ of incidence to the wafer 20 is reduced to improve the depth of focus DOF.

Figure 45:
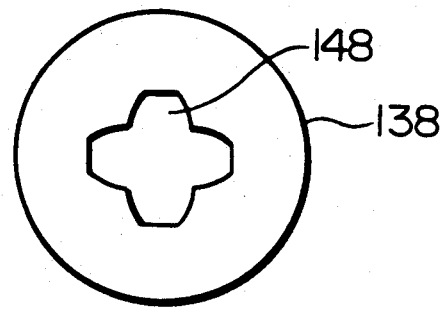
FIG. 45 is a plan view of an aperture member used in the 30th embodiment.
Figure 46:
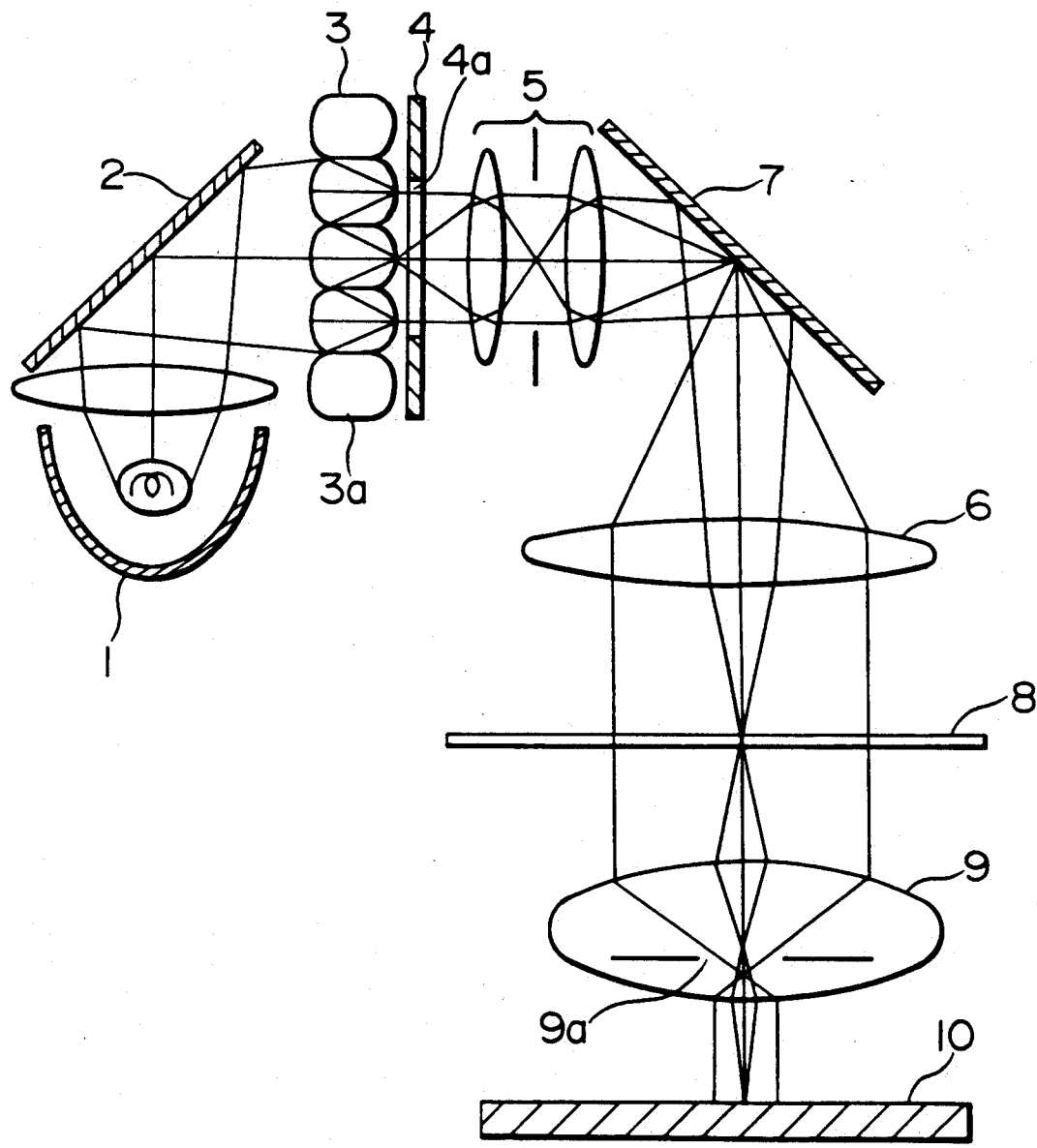
FIG. 46 is an illustration of an optical system of a known projection exposure apparatus.
Figure 47:
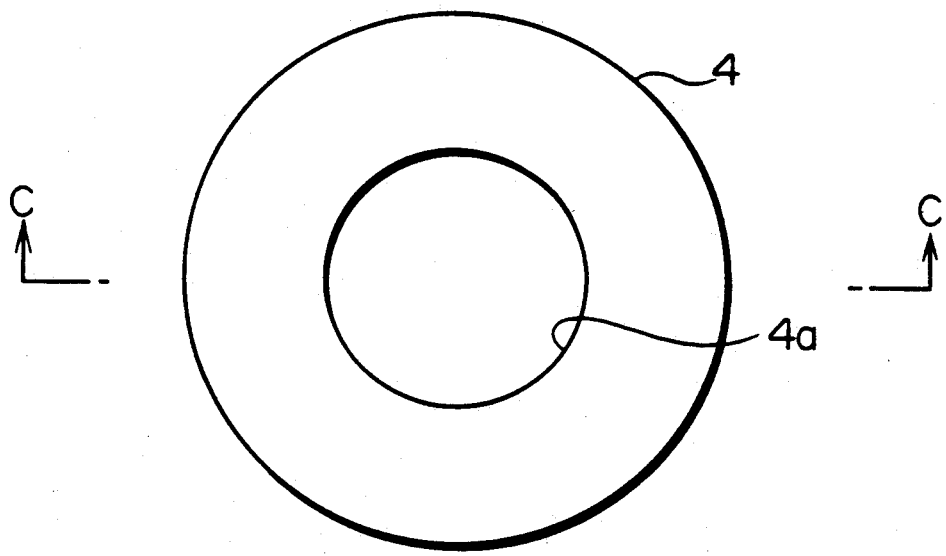
FIG. 47 is a plan view of an aperture member used in the apparatus of FIG. 46.
Figure 48:
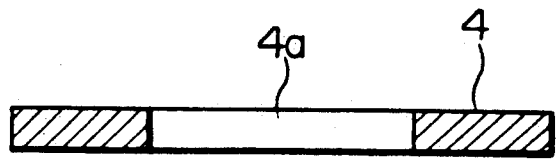
FIG. 48 is a sectional view taken along the line C—C of FIG. 47.
Figure 49:
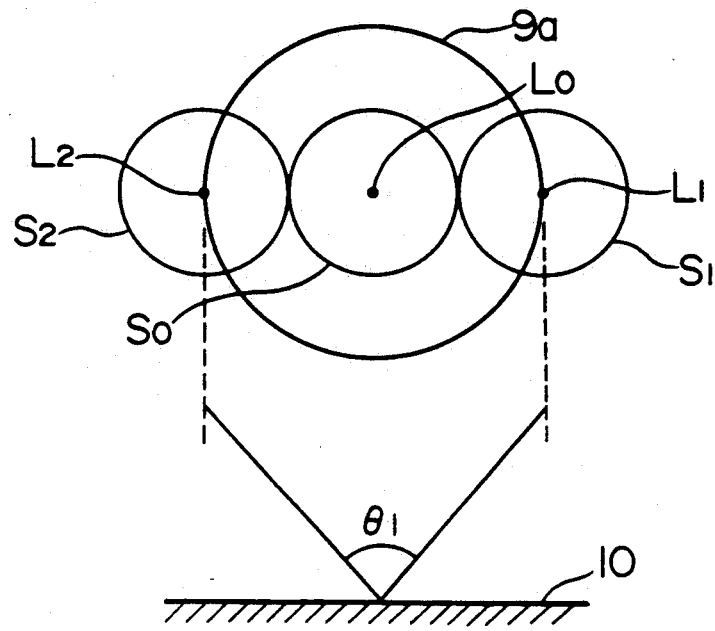
FIG. 49 is an illustration of the relationship between a light source image formed on the pupil of a projection lens system and the angle of incidence of light to a wafer, as obtained when the aperture member of FIG. 47 is used together with a mask having a circuit pattern which is a parallel-line pattern approximating resolution limit.
Figure 50:
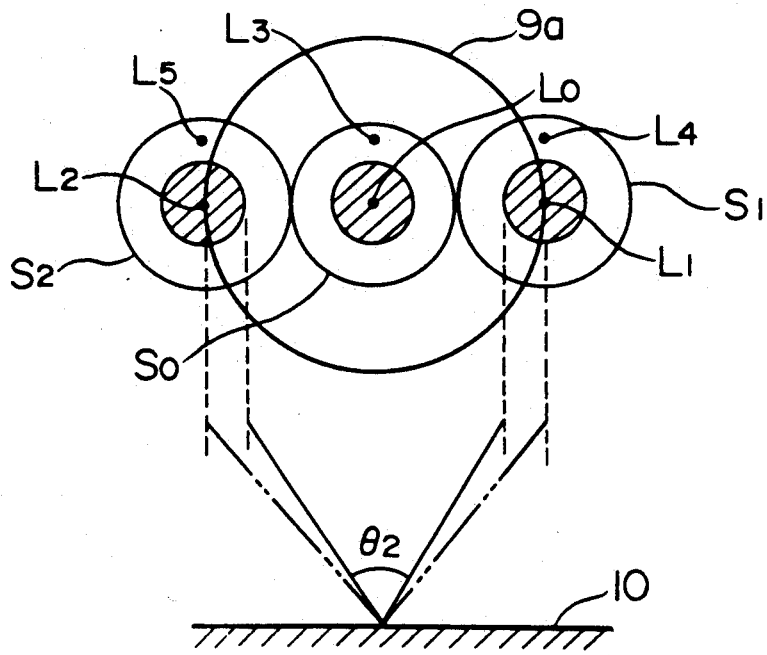
FIG. 50 is an illustration of the relationship between a light source image formed on the pupil of a projection lens system and the angle of incidence of light to a wafer, as obtained when a known aperture member is used together with a mask having a circuit pattern which is a parallel-line pattern approximating resolution limit.
Figure 51:
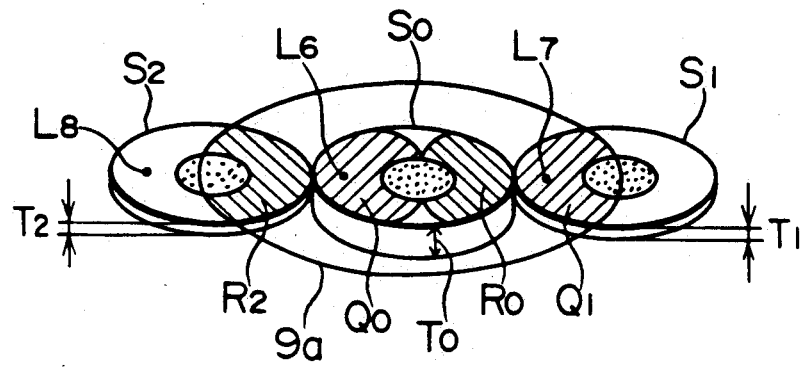
FIG. 51 is an illustration of light source images formed on the pupil of a projection lens system when another aperture member is used.

When the mask have parallel-line patterns orthogonal to each other, it is effective to use an aperture member 138 having a spindle-cross-shaped light-transmitting portion 146 as shown in FIG. 45.

What is claimed is:

1. A projection exposure apparatus, comprising:
   a light source;
   a light condensing optical system through which light from said light source is condensed and applied to a mask carrying a circuit pattern;
   a projection lens system which projects the light transmitted through said mask onto the surface of a wafer; and
   an aperture member which is interposed between the light source and said light condensing optical system;
   wherein said aperture member has a light transmission region for transmitting the light from said light source and a light-interrupting member disposed to extend across said light transmission region.

2. A projection exposure apparatus according to claim 1, wherein said aperture member has a light-interrupting member formed in a belt-like shape so as to extend across said light transmission region.

3. A projection exposure apparatus according to claim 1, wherein said aperture member has a light-interrupting member is formed in a bobbin-like shape so as to extend across said light transmission region.

4. A projection exposure apparatus according to claim 1, wherein said aperture member has a light-interrupting member formed in a cross-like form centered at the center of said light transmission region.

5. A projection exposure apparatus according to claim 1, wherein said aperture member has a light-interrupting member formed in a radial form centered at the center of said light transmission region.

6. A projection exposure apparatus according to claim 1, wherein said aperture member has first and second light-interrupting members formed in a belt-like shapes extending across said light transmission region and rotatable independently of each other about the center of said light transmission region.

7. A projection exposure apparatus according to claim 6, wherein said aperture member has a cylindrical casing, and first and second rotational members arranged for rotation about a common axis within said casing, each of said first and second rotational members including a disk-shaped frame having a circular central aperture, a light transmitting member closing the entire area of said aperture and a light-interrupting member formed on the surface of said transparent member so as to extend across said aperture.

8. A projection exposure apparatus according to claim 1, wherein said aperture member has a spindle-shaped light-interrupting member formed in the light-transmitting region.

9. A projection exposure apparatus according to claim 1, wherein said aperture member has a mesh-type light-interrupting member formed in the light-transmitting region.

10. A projection exposure apparatus according to claim 1, wherein said aperture member has a light-interrupting member made of a light-absorbing material formed in the light-transmitting region.

11. A projection exposure apparatus according to claim 1, wherein said mask has a circuit pattern formed with shifter-interruption type phase shift member.

12. A projection exposure apparatus according to claim 11, wherein said mask has a light-interrupting pattern for controlling light quantity, formed on the peripheral edge portion of said phase shift member.

13. A projection exposure apparatus according to claim 11, wherein said mask has a light-interrupting pattern for controlling light quantity, formed on the central portion of said phase shift member.

14. A projection exposure apparatus according to claim 11, wherein said mask has a circuit pattern formed by using a translucent phase shift member.

15. A projection exposure apparatus, comprising:
a light source;
a Levenson type phase shift mask on which a circuit pattern is formed;
a condenser lens system through which light emitted from said light source impinges upon said mask;
a projection lens system through which the light transmitted through said mask is focused on the surface of a wafer; and
an aperture member disposed between said light source and said condenser lens system and having a light-transmitting portion which is parallel to the pattern of said phase shift mask.

16. A projection exposure system according to claim 15, wherein said mask has a parallel-line pattern and said aperture member has a rectangular light-transmitting portion arranged in parallel with said parallel-line pattern of said phase shift mask.

17. A projection exposure system according to claim 15, wherein said mask has a parallel-line pattern and said aperture member has a plurality of light-transmitting portions arranged in parallel with said parallel-line pattern of said phase shift mask.

18. A projection exposure system according to claim 15, wherein said mask has a parallel-line pattern and said aperture member has a bobbin-shaped light-transmitting portion arranged in parallel with said parallel-line pattern of said phase shift mask.

19. A projection exposure system according to claim 15, wherein said mask has a parallel-line pattern and said aperture member has a spindle-shaped light-transmitting portion arranged in parallel with said parallel-line pattern of said phase shift mask.

20. A projection exposure system according to claim 15, wherein said mask has parallel line patterns orthogonal to each other and said aperture member has a cross-shaped light-transmitting portion arranged in parallel with said parallel-line patterns of said phase shift mask.

* * * * *